United States Patent
Raychowdhury et al.

(10) Patent No.: US 8,901,819 B2
(45) Date of Patent: Dec. 2, 2014

(54) MULTI-SUPPLY SEQUENTIAL LOGIC UNIT

(75) Inventors: Arijit Raychowdhury, Hillsboro, OR (US); Jaydeep P. Kulkarni, Hillsboro, OR (US); James W. Tschanz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/992,894

(22) PCT Filed: Dec. 14, 2011

(86) PCT No.: PCT/US2011/064848
§ 371 (c)(1),
(2), (4) Date: Jun. 10, 2013

(87) PCT Pub. No.: WO2013/089698
PCT Pub. Date: Jun. 20, 2013

(65) Prior Publication Data
US 2014/0218069 A1    Aug. 7, 2014

(51) Int. Cl.
*H03K 19/0175* (2006.01)
(52) U.S. Cl.
CPC .............................. *H03K 19/017509* (2013.01)
USPC .................... 315/82; 315/83; 315/95; 315/93
(58) Field of Classification Search
None
See application file for complete search history.

(56) References Cited

U.S. PATENT DOCUMENTS

| | | | |
|---|---|---|---|
| 5,483,176 A * | 1/1996 | Rodriguez et al. | 326/21 |
| 6,933,750 B2 * | 8/2005 | Takahashi et al. | 326/82 |
| 7,218,146 B2 * | 5/2007 | Shibata et al. | 326/82 |
| 7,298,172 B2 * | 11/2007 | Shibata et al. | 326/82 |
| 7,504,871 B2 | 3/2009 | Kim | |
| 7,535,257 B2 * | 5/2009 | Shibata et al. | 326/82 |
| 7,764,085 B2 * | 7/2010 | Takahashi et al. | 326/82 |
| 7,977,974 B2 * | 7/2011 | Onishi et al. | 326/47 |
| 2003/0062940 A1 | 4/2003 | Nedovic et al. | |
| 2003/0076149 A1 | 4/2003 | Haga | |
| 2005/0168243 A1 * | 8/2005 | Takahashi et al. | 326/83 |
| 2006/0097753 A1 * | 5/2006 | Shibata et al. | 326/83 |
| 2007/0182452 A1 * | 8/2007 | Shibata et al. | 326/82 |
| 2010/0026345 A1 * | 2/2010 | Li | 326/93 |

FOREIGN PATENT DOCUMENTS

KR    10-2010-0114156    10/2010

OTHER PUBLICATIONS

Int'l Search Report and Written Opinion mailed Jul. 16, 2012 for Int'l Patent Application No. PCT/US2011/064848.

* cited by examiner

*Primary Examiner* — Crystal L Hammond
(74) *Attorney, Agent, or Firm* — Blakely, Sokoloff, Taylor & Zafman LLP

(57) ABSTRACT

Described herein are apparatus, method, and system for reducing clock-to-output delay of a sequential logic unit in a processor. The apparatus comprises a sequential unit including: a data path, to receive an input signal, including logic gates to operate on a first power supply level, the data path to generate an output signal; and a clock path including logic gates to operate on a second power supply level, the logic gates of the clock path to sample the input signal using a sampling signal to generate the output signal, wherein the second power supply level is higher than the first power supply level. The apparatus improves (i.e. reduces) setup time of the sequential unit and allows the processor to operate at minimum operating voltage (Vmin) without degrading performance of the sequential unit.

25 Claims, 7 Drawing Sheets

US 8,901,819 B2

MULTI-SUPPLY SEQUENTIAL LOGIC UNIT

CLAIM OF PRIORITY

This application claims the benefit of priority of International Patent Application No. PCT/US2011/064848 filed Dec. 14, 2011, titled "MULTI-SUPPLY SEQUENTIAL LOGIC UNIT," which is incorporated by reference in its entirety.

FIELD OF THE INVENTION

Embodiments of the invention relate generally to the field of processors. More particularly, embodiments of the invention relate to an apparatus, system, and method for reducing clock-to-output delay and for improving timing parameters of a multi-supply sequential logic unit in a processor.

BACKGROUND

To reduce power dissipation in processors, logic gates of the processors are operated on minimum operating voltage (Vmin). The term "minimum operating voltage" herein refers to the minimum power supply voltage level for a process technology below which a logic gate or circuit does not operate correctly.

However, performance of sequential logic gates, such as flip-flops or latches degrades more than the performance of general combinational logic gates, such as NAND gate, NOR gates, inverters, etc. when the sequential logic gates and the general combinational logic gates are operated on Vmin power supply levels. The term "performance" herein generally refers to propagation delay of a signal from an input node to an output node of a logic gate. The term "performance" also refers to timing parameters such as setup time of a sequential logic unit. As power supply level reduces for a logic gate, the delay of the logic gate increases and so the performance of the logic gate degrades. When power supply level reduces for a sequential logic unit, setup time increases which degrades performance of the sequential logic unit.

FIG. 1 is typical flip-flop 100 with input D, output Q, and clock input CLK, which operates on a single power supply level. Flip-flops are generally placed at the boundaries of combinational logic (CL). Due to inherent contention in the data path of a flip-flop 100, the clock-to-output (CLK-Q) delay increases as power supply level reduces (e.g., at Vmin), for the flip-flop 100. Furthermore, operating the flip-flop at reduced power supply levels (e.g., at Vmin), causes the setup time of the flip-flop 100 to increase, thus degrading its performance.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

SUMMARY

Figure 1:
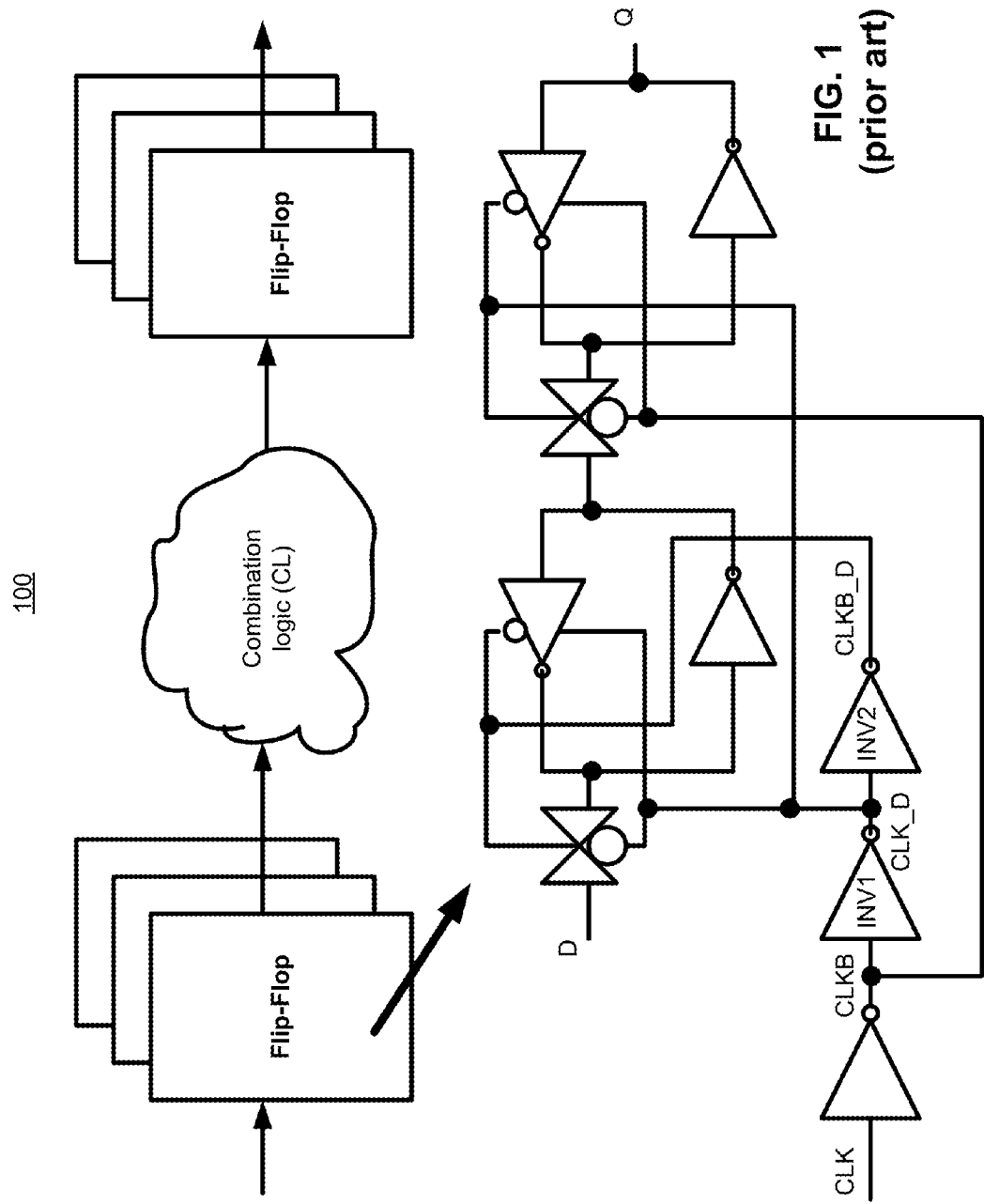
FIG. 1 is a flip-flop operating on a single power supply.

The following presents a simplified summary of the embodiments of the invention in order to provide a basic understanding of some aspects of the embodiments. This summary is not an extensive overview of the embodiments of the invention. It is intended to neither identify key or critical elements of the embodiments nor delineate the scope of the embodiments. Its sole purpose is to present some concepts of the embodiments of the invention in a simplified form as a prelude to the more detailed description that is presented later.

Embodiments of the invention relate to apparatus, system, and method for reducing clock-to-output delay and for improving timing parameters of a multi-supply sequential logic unit in a processor.

In one embodiment, the apparatus comprises: a data path, to receive an input signal, including logic gates to operate on a first power supply level, the data path to generate an output signal; and a clock path including logic gates to operate on a second power supply level, the logic gates of the clock path to sample the input signal using a sampling signal to generate the output signal, wherein the second power supply level is higher than the first power supply level. In one embodiment, the system comprises: a wireless connectivity; and a processor communicatively coupled to the wireless connectivity, the processor including: a sequential logic unit, i.e. the apparatus.

In one embodiment, the method comprises: providing an input signal to a data path including logic gates operating on a first power supply level; generating an output signal from the data path; providing a clock signal to a clock path including logic gates operating on a second power supply level; and generating a sampling signal by the clock path to sample the input signal for generating the output signal, wherein the second power supply level is higher than the first power supply level.

The following description and the annexed drawings set forth in detail certain illustrative aspects of the embodiments of the invention. These aspects are indicative, however, of but a few of the various ways in which the principles of the embodiments of the invention may be employed. The embodiments of the invention are intended to embrace all equivalents in the form of alternatives, modifications, and variations that fall within the broad scope of the appended claims. Other advantages and novel features of the embodiments of the invention will become apparent from the following detailed description of the embodiments of the invention when considered in conjunction with the drawings.

DETAILED DESCRIPTION

Embodiments of the invention relate to an apparatus, system, and method for reducing clock-to-output delay and for improving timing parameters of a multi-supply sequential logic unit in a processor.

The embodiments discussed herein provide optimal power supply levels to a sequential logic unit to enable an overall lower Vmin for the logic units of the processor. A lower Vmin translates to power savings and thus improves the performance of the processor. In one embodiment, the clock signal path of the sequential logic unit is operated on a different power supply level than the data signal path of the sequential logic unit. For example, the data signal path is operated on Vmin power supply level while the clock signal path is operated on different power supply level which is higher than Vmin power supply level.

In such an embodiment, the power supply level of the data path of the processor can be set to Vmin power supply level without the sequential logic unit being the bottleneck to operate the data path of the processor on Vmin power supply level. By boosting the clock path, i.e. operating the clock path on a higher power supply level compared to the power supply level of the data path, the inherent data contention in the sequential logic unit is reduced resulting in a faster resolution of data which in turn results in a faster data path (e.g., faster by 50% over the data path speed of the flip-flop 100 of FIG. 1). The embodiments discussed herein also allow the clock distribution network to operate on the lower power supply level (Vmin) to reduce the power consumption in the clock distribution network.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein refers to two or more elements which are in direct contact (physically, electrically, magnetically, optically, etc.). The term "coupled" herein may also refer to two or more elements that are not in direct contact with each other, but still cooperate or interact with each other.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

So as not to obscure the embodiments of the invention, the sequential logic unit described herein is a flip-flop. However, the essence of the embodiments of the invention is applicable to all kinds of sequential logic units including, latches, set-reset flip-flops, toggle flip flops, etc.

Figure 2:
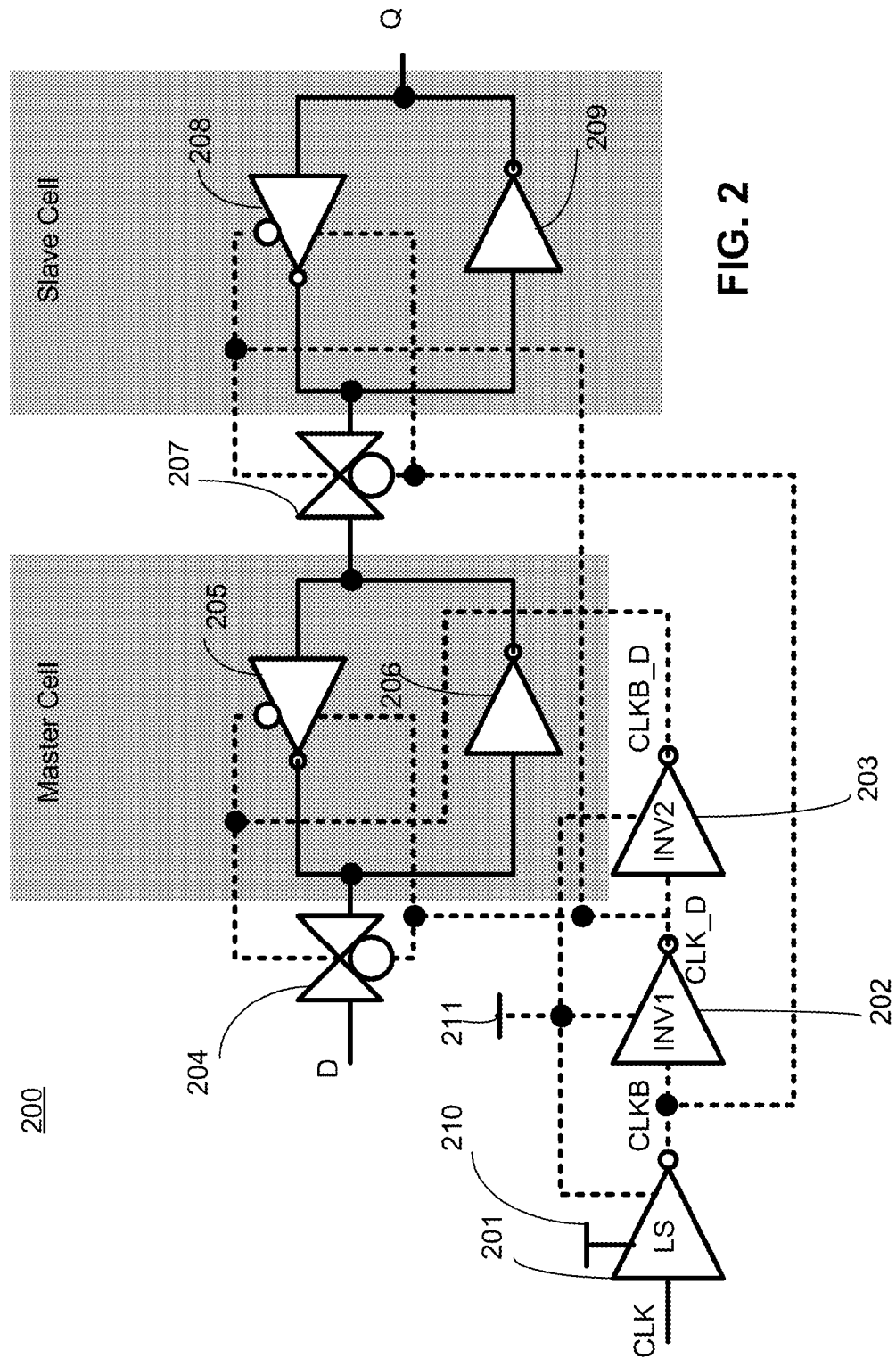
FIG. 2 is a multi-supply flip-flop sequential logic unit, according to one embodiment of the invention.

FIG. 2 is a multi-supply flip-flop sequential logic unit 200 (also called multi-supply FF), according to one embodiment of the invention. In one embodiment, the multi-supply FF receives input data 'D' which is sampled by the clock signal CLK to generate an synchronized output 'Q.' In one embodiment, the multi-supply FF is configured to receive at least two power supplies—first power supply 210 and second power supply 211. The dotted lines represent the signal path operating on the second power supply 211 while the solid lines represent signal path operating on the first power supply 210. The term "power supply" and "power supply level" are used interchangeably. In the embodiments discussed herein the first power supply level 210 can be adjusted independently of the second power supply 211 and vice versa.

In one embodiment, the multi-supply FF 200 includes a level-shifter 201 in a clock path, wherein the level-shifter 201 is operable to level-shift the CLK signal from the first power supply level 210 to CLKB signal which operates on the second power supply level 211. In one embodiment, the level-shifter 201 provides a 50% duty cycle output and is compensated for voltage variations. In other embodiments, other forms of level-shifters may be used for the level-shifter 201. In this embodiment, the level-shifter 201 is positioned inside the multi-supply FF 200. However, in other embodiments, the level-shifter 201 may be shared among several multi-supply FFs and may be positioned outside the multi-supply FF 200.

In the embodiment of FIG. 2, the clock path comprises the level-shifter 201 and inverters 202 and 203 that provide a sampling clock signal to the pass-gates 204 and 207, and enable/disable the inverters 205 and 208. The sampling clock signal, i.e. the output of the level-shifter 201 and inverters 202 and 203, has a higher voltage swing than the data signal 'D' and the signals in the data path discussed below. The reason for the sampling clock signal, i.e. the output of the level-shifter 201 and inverters 202 and 203, to have a higher voltage swing than the data input signal 'D' and signals in the data path is that the level-shifter 201 and inverters 202 and 203 operate on the second power supply level 211 which is higher than the first power supply level 210. In one embodiment, the level-shifter 201 converts the CLK signal from the first power supply level 210 to the second power supply level 211. The level-shifted CLK signal has a higher voltage swing than the input signal 'D.'

In this embodiment, the data path is the path from signal 'D' to output 'Q' and comprises the pass-gate 204, the master cell inverters 205 and 206, the pass-gate 207, and the slave cell inverters 208 and 209. The pass-gates 204 and 207 are also called transmission gates and comprise P and N transistors connected in parallel to one another. In one embodiment, the logic gates (pass-gate 204, inverters 205 and 206, pass-gate 207, and inverters 208 and 209) operate on the first power supply level 210 which is lower than the second power supply level 211. The voltage swing of the signals in the data path is lower than the voltage swing of the signals in the clock signal path because the first power supply level 210 is lower than the second power supply level 211.

In the embodiments discussed herein, the CLK-Q delay, which is the time it takes from a transition of the clock signal CLK to when the data 'D' propagates as output 'Q,' reduces because the clock signal path is operating on a higher power supply level 211 than the power supply level of the data path 210. By operating the clock signal path (also called clock path) on a higher power supply level 211, the data contention inherent in the single supply flip-flip 100 is reduced for the multi-supply FF 200 because the clock signal is stronger (being on a higher power supply level) than the data signal. By reducing data contention in the multi-supply FF 200, the probability of meta-stability in the multi-supply FF 200 is also reduced compared to the probability of meta-stability in the FF 100 of FIG. 1. By reducing data contention in the multi-supply FF 200 and by boosting the clock path, i.e.

placing the clock path on a higher power supply level than the data path, the setup time of the multi-supply FF 200 improves over the setup time of the single supply FF 100 of FIG. 1.

Figure 3:
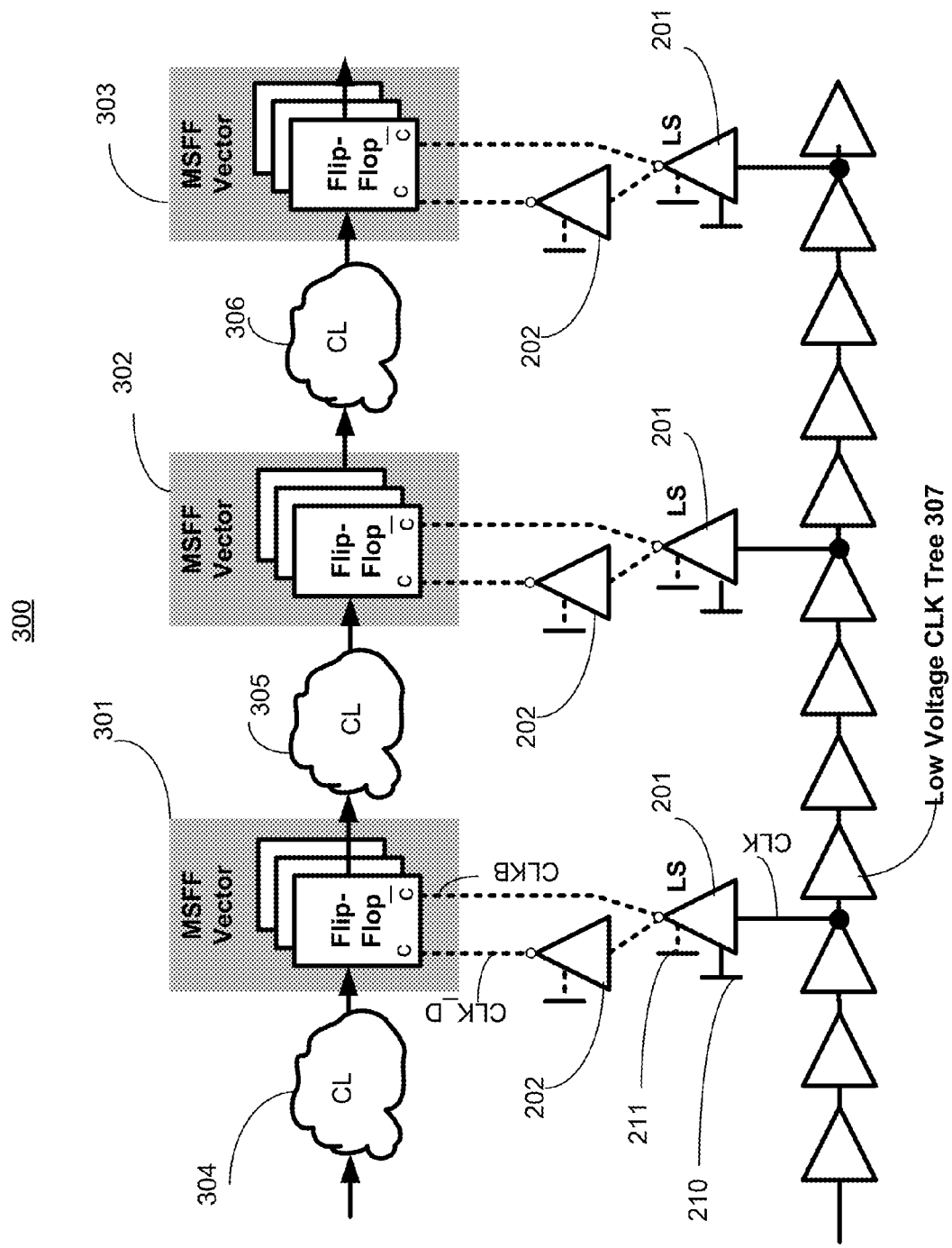
FIG. 3 is a vectored sequential logic configuration, according to one embodiment of the invention.

FIG. 3 is a vectored sequential logic configuration 300, according to one embodiment of the invention. The term "vectored configuration" herein refers to two or more FFs that are grouped together such that they require the same clock signal to sample their respective data input signals. In one embodiment, the clock pipeline (or clock signal path) for the vectored configuration of the FFs is positioned outside the level-shifter 201 discussed with reference to FIG. 2. For example, the level-shifter 201 and the inverters 202 and 203 discussed with reference to FIG. 2 are positioned outside the multi-supply FF 200 for FIG. 3. In this embodiment, the vectored FFs receive both the sampling clock signal and the inverted sampling clock signal on the second power supply 211 as inputs to the vectored FFs.

Referring back to FIG. 3, the dotted lines from the level-shifter 201 represent the signal path operating on the second power supply level 211 while the solid lines from the logic gates (buffers, etc) represent signal path operating on the first power supply level 210. The architecture 300 of FIG. 3 illustrates three sets of vectored FFs—301, 302 and 303—which are positioned between combinational logic (CL) 304, 305, and 306, respectively. In this embodiment, the clock tree 307, the combinational logics 304, 305, and 306, and the FFs operate on the first power supply level 210.

In one embodiment, the power consumption of the vectored FFs 301, 302 and 303 is further reduced because the level-shifter 201 and inverter 202 are positioned outside the multi-supply FF 200 of FIG. 2 and are shared with multiple FFs, i.e. both sampling clock signal CLK_D and its inverted version CLK_B are sent to the vectored FFs 301, 302, and 303. In this embodiment, the power supply routing congestion is reduced because the second power supply 211 is no longer routed inside the vectored FFs 301, 302 and 303. In such an embodiment, the area of the vectored FFs is also reduced because the level-shifter 201 and inverter 202 are positioned outside the vectored FFs. In one embodiment, the second power supply level 211 is locally generated by a voltage regulator or is at the same level as the power supply for the data path when the data path is not operating on Vmin. In such an embodiment, the level of the second power supply level 211 can be independently adjusted with reference to the first power supply level 210.

Figure 4:
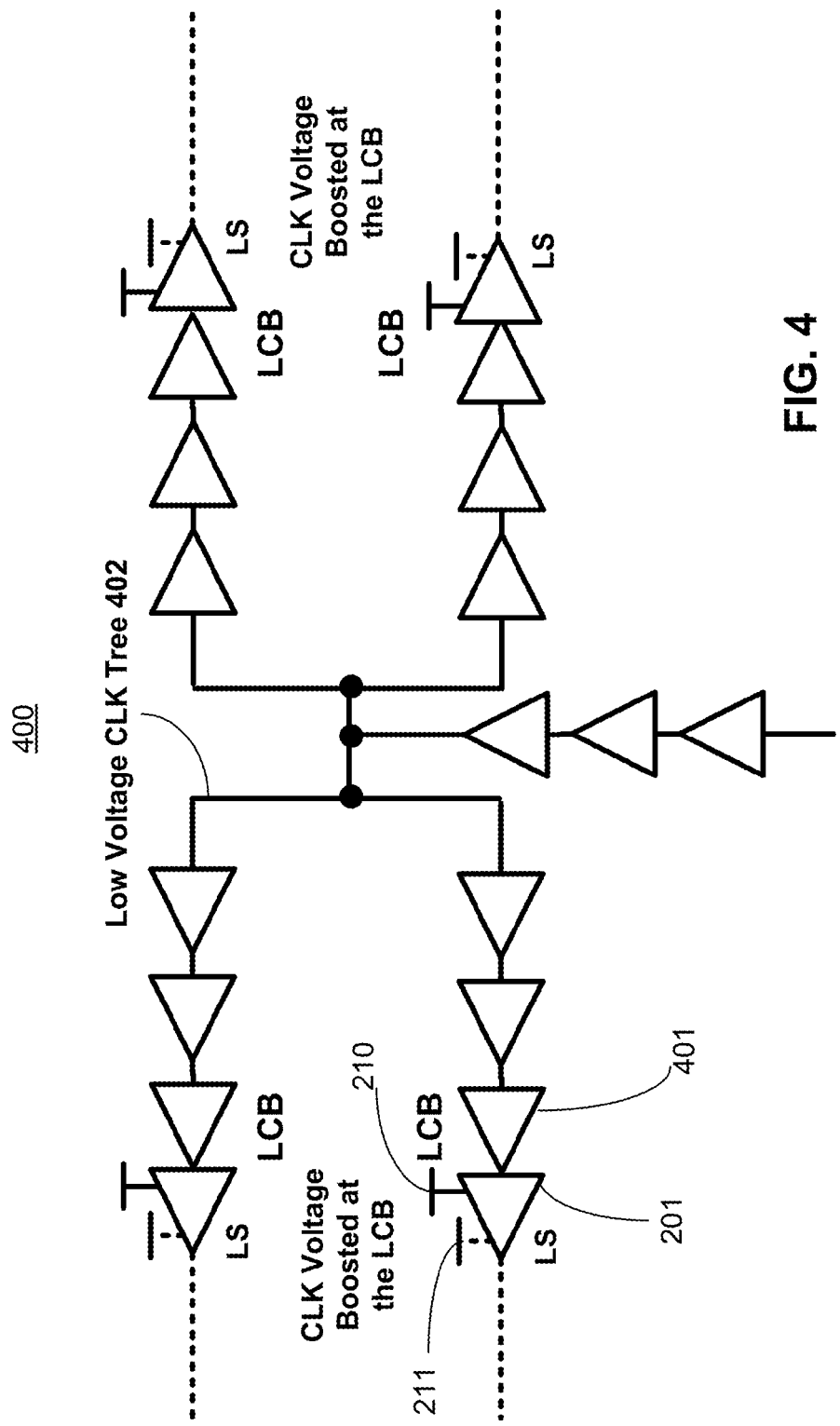
FIG. 4 is a non-vectored sequential logic configuration, according to one embodiment of the invention.

FIG. 4 is a non-vectored sequential logic configuration 400, according to one embodiment of the invention. The term "non-vectored configuration" herein refers to distributed FFs that are not grouped together. In such a configuration the same clock signal from the same clock distribution point is not transmitted to a group of FFs. In this embodiment, the dotted lines from the level-shifter 201 represent the signal path operating on the second power supply level 211 while the solid lines from the logic gates buffers (e.g., 401 and clock tree buffers 402) represent a signal path operating on the first power supply level 210. The buffer 401 is also called the local clock buffer which is closer in distance to the FF than a global clock buffer (not shown) which transmits clock signals over a distribution network to the buffer 401.

In the non-vectored sequential logic configuration, level-shifter 201 is positioned outside the FF while the inverters 202 and 203 are positioned inside the FF. In such an embodiment, the FF continues to be supplied with first and second power supply levels 210 and 211. The data path of the FF operates on the first power supply level 210 while the clock signal path of the FF operates on the second power supply level 211.

Figure 5:
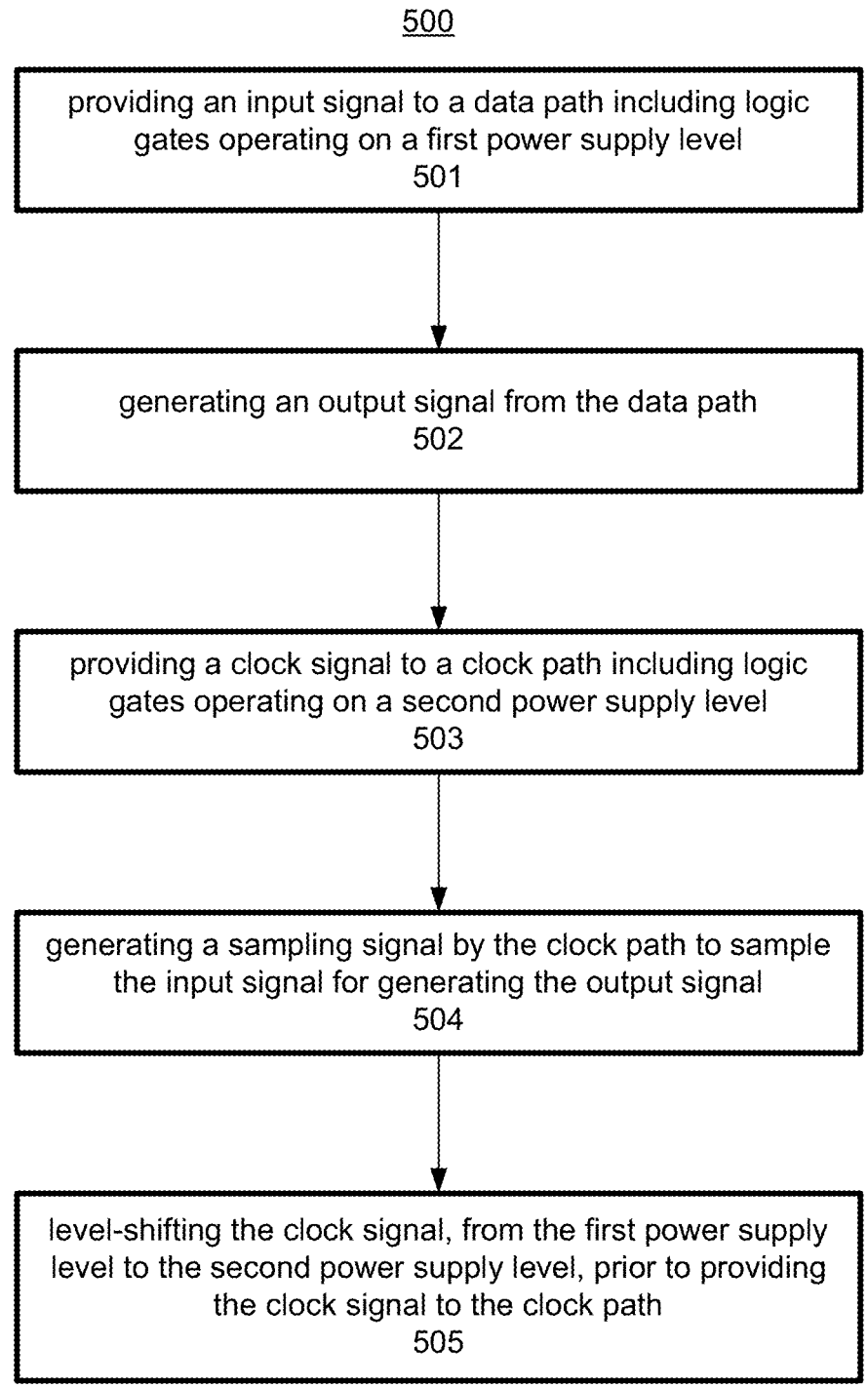
FIG. 5 is a method flowchart for reducing clock-to-output delay and for improving timing parameters, according to one embodiment of the invention.

FIG. 5 is a method flowchart 500 for reducing clock-to-output (CLK-Q) delay and for improving timing parameters (e.g., setup time) via the multi-supply FF 200, according to one embodiment of the invention.

Although the blocks in the flowchart 500 are shown in a particular order, the order of the actions can be modified. Thus, the illustrated embodiments can be performed in a different order, and some actions/blocks may be performed in parallel. Additionally, one or more actions/blocks can be omitted in various embodiments for reducing CLK-Q delay and improving timing parameters for a sequential logic unit. The flowchart of FIG. 5 is illustrated with reference to the embodiments of FIGS. 2-4.

At block 501, an input signal 'D' is provided to a data path including logic gates operating on a first power supply level 210. The data path is the path from signal 'D' to output 'Q' and comprises the pass-gate 204, the master cell inverters 205 and 206, the pass-gate 207, and the slave cell inverters 208 and 209. At block 502, an output signal 'Q' is generated from the data path. In one embodiment, the first power supply level 210 is the minimum operating power supply voltage level for the logic gates in the data path. In one embodiment, the data path is independent of any level-shifter as described with reference to FIG. 2.

In one embodiment, the data path comprises: a master cell to receive the input signal; and a slave cell, coupled to the master cell, to generate the output signal, wherein the method further comprises: providing the slave cell the second power supply level 211; and providing the master cell, including the logic gates of the data path, the first power supply level 210. The above embodiment corresponds to FIG. 7 which is discussed below.

Referring back to FIG. 5, at block 503 the clock signal CLK is provided to the clock path including logic gates operating on a second power supply level 211. The clock path comprises the level-shifter 201 and inverters 202 and 203 that provide a sampling clock signal to the pass-gates 204 and 207, and enable/disable the inverters 205 and 208.

At block 504, a sampling signal is generated by the clock path to sample the input signal 'D' for generating the output signal 'Q,' wherein the second power supply level 211 is higher than the first power supply level 210. At block 505, the level shifter 201 level-shifts the clock signal CLK, from the first power supply level 210 to the second power supply level 211, prior to providing the clock signal to the clock path. In one embodiment, the level-shifting is performed by the level-shifter 201 at output of a clock distribution network as discussed with reference to FIGS. 3-4.

Figure 6:
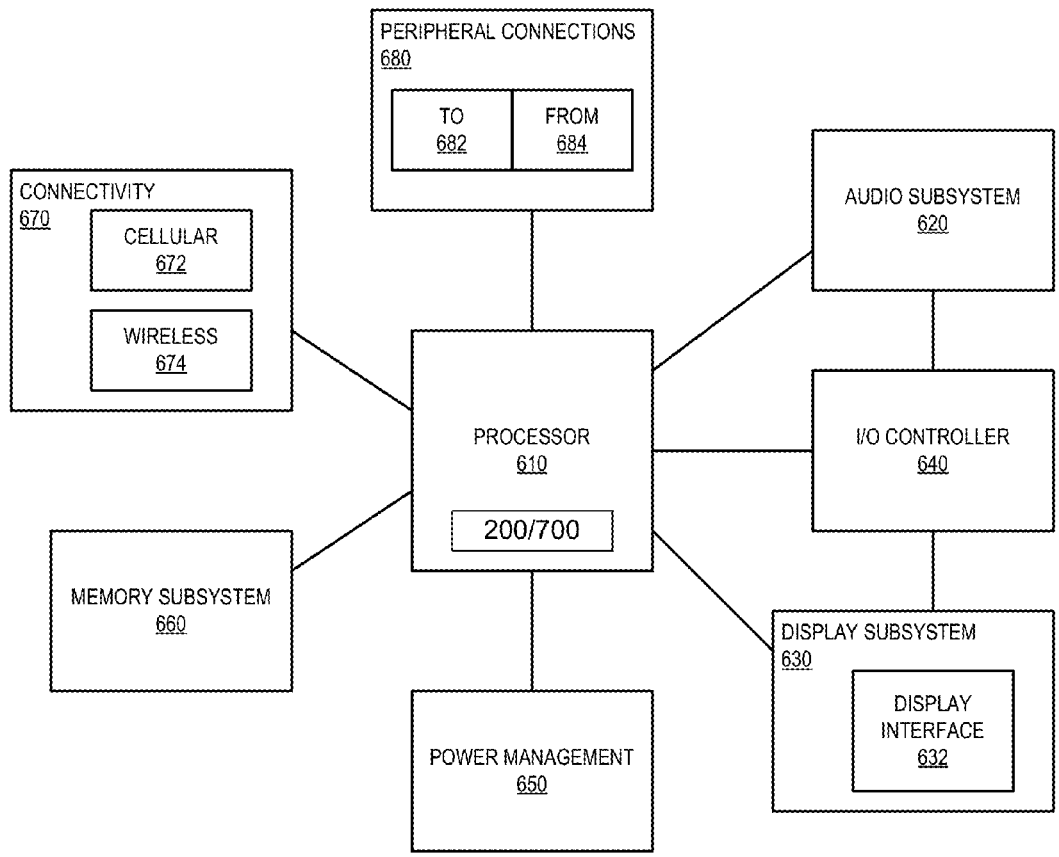
FIG. 6 is a system level diagram of a smart device comprising a processor including the multi-supply sequential logic unit for reducing clock-to-output delay and for improving timing parameters, according to one embodiment of the invention.

FIG. 6 is a system-level diagram of a device comprising a processor comprising the multi-supply sequential logic unit for reducing clock-to-output delay and improving timing parameters, according to one embodiment of the invention. FIG. 6 is a block diagram of an embodiment of a mobile device in which flat surface interface connectors could be used. Computing device 600 represents a mobile computing device, such as a computing tablet, a mobile phone or smartphone, a wireless-enabled e-reader, or other wireless mobile device. It will be understood that certain of the components are shown generally, and not all components of such a device are shown in device 600.

Device 600 includes processor 610, which performs the primary processing operations of device 600. In one embodiment, the processor 610 includes the multi-supply FF 200 (and 700 discussed with reference to FIG. 7). The processor 610 may have both vectored and non-vectored configurations of the FF as discussed with reference to FIGS. 3-4.

Referring back to FIG. 6, the processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, the I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation.

Memory subsystem 660 includes memory devices for storing information in device 600. Memory can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600.

Elements of embodiments are also provided as a machine-readable medium (e.g., memory 660) for storing the computer-executable instructions (e.g., instructions to implement the flowchart of FIG. 5 and any other processes discussed above). The machine-readable medium (e.g., memory 660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description.

Figure 7:
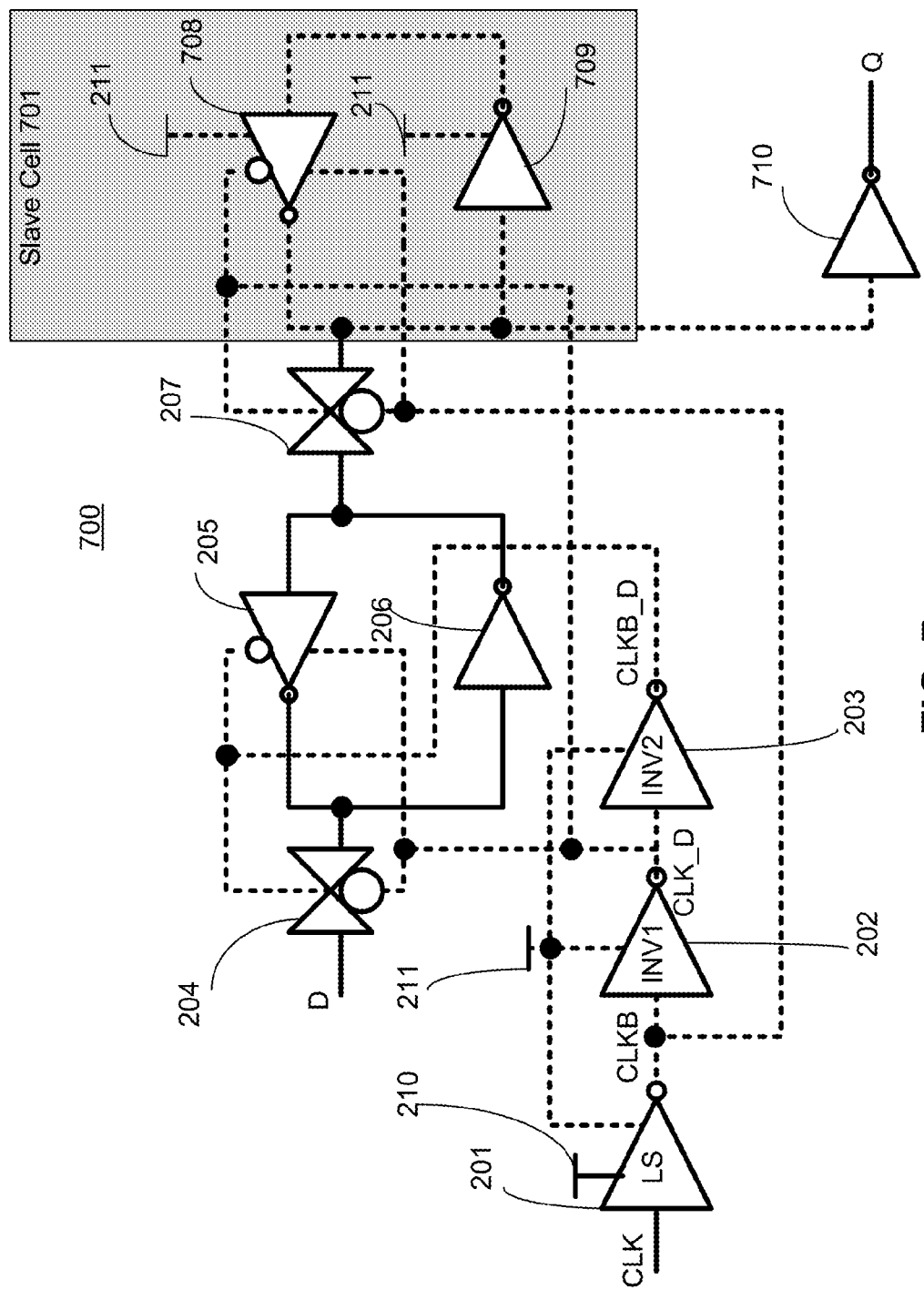
FIG. 7 is a multi-supply flip-flop sequential logic unit with boosted slave latch, according to one embodiment of the invention.

For example, to enhance retention of data in the sequential logic unit, the slave cell portion of the sequential logic unit may be operated on a higher power supply than the master cell portion of the sequential logic unit. FIG. 7 is a multi-supply FF sequential logic unit 700 with boosted slave latch, according to one embodiment of the invention. To avoid repetitiveness, only the differences between FIG. 2 and FIG. 7 are discussed herein. The dotted lines represent the signal path operating on the second power supply 211 while the solid lines represent signal path operating on power the first power supply 210.

In one embodiment, the slave cell portion 701 comprises the inverters 708 and 709. In this embodiment, the inverters 708 and 709 are operated on the second power supply level 211 like the clock path. In such an embodiment, no additional level-shifter is needed for the slave cell 701. In one embodiment, output driver 710 can be downsized (in terms of transistor W/L) because the slave cell 701 is operating on the second power supply level 211 which is higher than the first power supply level 210.

The embodiments of the invention are intended to embrace all such alternatives, modifications, and variations as to fall within the broad scope of the appended claims.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a data path, to receive an input signal, including logic gates to operate on a first power supply level, the data path to generate an output signal; and
a clock path including logic gates to operate on a second power supply level, the logic gates of the clock path to sample the input signal using a sampling signal to generate the output signal.

2. The apparatus of claim 1, wherein the second power supply level is higher than the first power supply level.

3. The apparatus of claim 1, wherein the logic gates of the clock path include a level-shifter to level shift a clock signal from the first power supply level to the second power supply level before generating the sampling signal.

4. The apparatus of claim 1 further comprises:
a level-shifter coupled to an output node of a clock distribution network.

5. The apparatus of claim 4 further comprises:
a buffer coupled to the level-shifter to provide a clock signal to the logic gates of the clock path, the clock signal operating on the second power supply level.

6. The apparatus of claim 1, wherein the data path comprises:
a master cell to receive the input signal; and
a slave cell, coupled to the master cell, to generate the output signal.

7. The apparatus of claim 1, wherein the slave cell operates on the second power supply level while the master cell, including the logic gates of the data path, operates on the first power supply level.

8. The apparatus of claim 1, wherein the first power supply level is a minimum operating power supply voltage level for the logic gates in the data path.

9. The apparatus of claim 1 further comprises:
a level-shifter to level shift a clock signal from the first power supply level to the second power supply level, the level-shifter to generate the sampling signal.

10. The apparatus of claim 9 further comprises:
an inverter to invert the sampling signal to generate the inverted sampling signal.

11. The apparatus of claim 10, wherein the sampling signal and the inverted sampling signal are distributed to vectored sequential logic circuits.

12. The apparatus of claim 1 further comprises:
a level-shifter to level shift a clock signal from the first power supply level to the second power supply level, the level-shifter to generate the sampling signal, wherein the sampling signal is distributed to vectored sequential logic circuits.

13. The apparatus of claim 1, wherein the data path is independent of any level-shifter.

14. A method comprising:
providing an input signal to a data path including logic gates operating on a first power supply level;
generating an output signal from the data path;
providing a clock signal to a clock path including logic gates operating on a second power supply level; and
generating a sampling signal by the logic gates of the clock path to sample the input signal for generating the output signal,
wherein the second power supply level is higher than the first power supply level.

15. The method of claim 14 further comprises:
level-shifting the clock signal, from the first power supply level to the second power supply level, prior to providing the clock signal to the clock path.

16. A system comprising:
a wireless connectivity; and
a processor communicatively coupled to the wireless connectivity, the processor including:
a sequential logic unit comprising:
a data path, to receive an input signal, including logic gates to operate on a first power supply level, the data path to generate an output signal; and
a clock path including logic gates to operate on a second power supply level, the logic gates of the clock path to sample the input signal using a sample signal to generate the output signal.

17. The system of claim 16, wherein the second power supply level is higher than the first power supply level.

18. The system of claim 16 further comprises a display unit which is touch screen.

19. The system of claim 16, wherein the logic gates of the clock path include a level-shifter to level shift a clock signal from the first power supply level to the second power supply level before generating the sampling signal, wherein the processor further comprises a buffer coupled to the level-shifter to provide a clock signal to the logic gates of the clock path, the clock signal operating on the second power supply level.

20. The system of claim 16, wherein the processor further comprises:
a level-shifter coupled to an output node of a clock distribution network.

21. The system of claim 16, wherein the data path comprises:
a master cell to receive the input signal; and
a slave cell, coupled to the master cell, to generate the output signal,
wherein the slave cell operates on the second power supply level while the master cell, including the logic gates of the data path, operates on the first power supply level.

22. The system of claim 16, wherein the first power supply level is a minimum operating power supply voltage level for the logic gates in the data path.

23. The system of claim 16, wherein the processor further comprises:
a level-shifter to level shift a clock signal from the first power supply level to the second power supply level, the level-shifter to generate the sampling signal; and
an inverter to invert the sampling signal to generate the inverted sampling signal, wherein the sampling signal and the inverted sampling signal are distributed to vectored sequential logic circuits.

24. The system of claim 16, wherein the processor further comprises:
a level-shifter to level shift a clock signal from the first power supply level to the second power supply level, the level-shifter to generate the sampling signal,
wherein the sampling signal is distributed to vectored sequential logic circuits.

25. The system of claim 16, wherein the data path is independent of any level-shifter.

* * * * *

UNITED STATES PATENT AND TRADEMARK OFFICE
CERTIFICATE OF CORRECTION

| | |
|---|---|
| PATENT NO. | : 8,901,819 B2 |
| APPLICATION NO. | : 13/992894 |
| DATED | : December 2, 2014 |
| INVENTOR(S) | : Raychowdhury et al. |

It is certified that error appears in the above-identified patent and that said Letters Patent is hereby corrected as shown below:

Please insert in column 1, line 3 before CLAIM OF PRIORITY:

--STATEMENT OF GOVERNMENT INTEREST

This invention was made with Government support under contract number HR0011-10-3-0007 awarded by the Department of Defense. The Government has certain rights in this invention.--

Signed and Sealed this
Third Day of November, 2015

Michelle K. Lee
*Director of the United States Patent and Trademark Office*